United States Patent
Qu et al.

(10) Patent No.: US 9,209,818 B2
(45) Date of Patent: *Dec. 8, 2015

(54) ON DIE JITTER TOLERANCE TEST

(71) Applicant: Parade Technologies, Ltd., George Town, Grand Cayman (KY)

(72) Inventors: Ming Qu, Campbell, CA (US); Yuanping Chen, Cupertino, CA (US); Yuntao Zhu, Shanghai (CN); Quan Yu, Shanghai (CN); Kochung Lee, San Jose, CA (US)

(73) Assignee: Parade Technologies, Ltd., George Town, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/544,382

(22) Filed: Dec. 30, 2014

(65) Prior Publication Data

US 2015/0109037 A1    Apr. 23, 2015

Related U.S. Application Data

(63) Continuation of application No. 13/538,930, filed on Jun. 29, 2012, now Pat. No. 8,923,375.

(51) Int. Cl.
| | |
|---|---|
| *H03L 7/087* | (2006.01) |
| *H04B 17/00* | (2015.01) |
| *H04L 1/20* | (2006.01) |
| *H04L 7/033* | (2006.01) |
| *H03L 7/08* | (2006.01) |
| *H03L 7/081* | (2006.01) |
| *H03L 7/099* | (2006.01) |
| *G01R 29/26* | (2006.01) |

(52) U.S. Cl.
CPC ............. *H03L 7/087* (2013.01); *G01R 29/26* (2013.01); *H03L 7/081* (2013.01); *H03L 7/0807* (2013.01); *H03L 7/0998* (2013.01); *H04B 17/00* (2013.01); *H04L 1/205* (2013.01); *H04L 7/033* (2013.01)

(58) Field of Classification Search
USPC ............................. 375/226; 327/156; 702/69
See application file for complete search history.

(56) References Cited

U.S. PATENT DOCUMENTS

| | | |
|---|---|---|
| 5,889,435 A | 3/1999 | Smith et al. |
| 6,819,728 B2 | 11/2004 | Boerstler |
| 6,914,953 B2 | 7/2005 | Boerstler |
| 7,109,765 B1 | 9/2006 | Wang et al. |
| 7,765,425 B1 | 7/2010 | Searles et al. |
| 7,936,193 B2 | 5/2011 | Van Der Wel et al. |
| 2002/0085657 A1 | 7/2002 | Boerstler |

(Continued)

OTHER PUBLICATIONS

United States Office Action, U.S. Appl. No. 13/538,930, Mar. 4, 2014, 15 pages.

*Primary Examiner* — Eva Puente
(74) *Attorney, Agent, or Firm* — Fenwick & West

(57) ABSTRACT

A system and method are disclosed for performing on die jitter tolerance testing. A set of clocks are generated based on an input signal. The set of clocks include in an in-phase signal based on the data switching edge of the input signal. Additionally, the set of clocks include an inverted clock phase shifted by 180 degrees, and a pair of clocks phase shifted positively and negatively by a certain number of degrees, $\theta$. Data input is sampled based on the inverted clock and the two phase shifted clocks. The eye opening of the input signal can be determined based on whether each of the inverted clock and the two phase shifted clocks sample the correct data from the input signal at various $\theta$ values.

21 Claims, 6 Drawing Sheets

Full Rate Case

(56) References Cited

U.S. PATENT DOCUMENTS

| | | |
|---|---|---|
| 2002/0085658 A1 | 7/2002 | Boerstler |
| 2003/0214335 A1 | 11/2003 | Saeki |
| 2005/0046456 A1 | 3/2005 | d'Haene et al. |
| 2006/0001494 A1* | 1/2006 | Garlepp et al. ............... 331/2 |
| 2006/0064258 A1* | 3/2006 | Mochizuki ............... 702/69 |
| 2006/0285583 A1 | 12/2006 | Baumgartner et al. |
| 2006/0285584 A1 | 12/2006 | Baumgartner et al. |
| 2008/0228417 A1 | 9/2008 | Baba et al. |
| 2009/0243679 A1 | 10/2009 | Smith et al. |
| 2010/0085093 A1 | 4/2010 | Van Der Wel et al. |
| 2010/0097071 A1 | 4/2010 | Lee et al. |
| 2011/0295536 A1 | 12/2011 | Yoda et al. |
| 2012/0038400 A1* | 2/2012 | Talaga, Jr. ............... 327/156 |
| 2012/0072784 A1* | 3/2012 | Li et al. ............... 714/704 |
| 2012/0098571 A1 | 4/2012 | Feist et al. |
| 2014/0029657 A1* | 1/2014 | Wu ............... 375/226 |

\* cited by examiner

Full Rate Case

ON DIE JITTER TOLERANCE TEST

CROSS REFERENCE TO RELATED APPLICATIONS

This application is a continuation of U.S. application Ser. No. 13/538,930, filed Jun. 29, 2012, now U.S. Pat. No. 8,923,375, which is incorporated by reference in its entirety.

BACKGROUND

1. Field of Art

The disclosure generally relates to jitter tolerance tests. More specifically, the disclosure relates to a system and method for performing on die jitter tolerance tests.

2. Description of the Related Art

Jitter tolerance tests measure the ability of a component to maintain an acceptable bit error rate when various levels of jitter are applied to the component. Jitter tolerance tests are typically performed in a lab environment with expensive equipment and consuming a significant amount of time. During production or assembly, it can be difficult to accurately perform jitter tolerance tests on incomplete chips. After assembly, it may be difficult to access a high speed test point on a chip. A high speed test point is often used to loop back and analyze during jitter tolerance testing.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
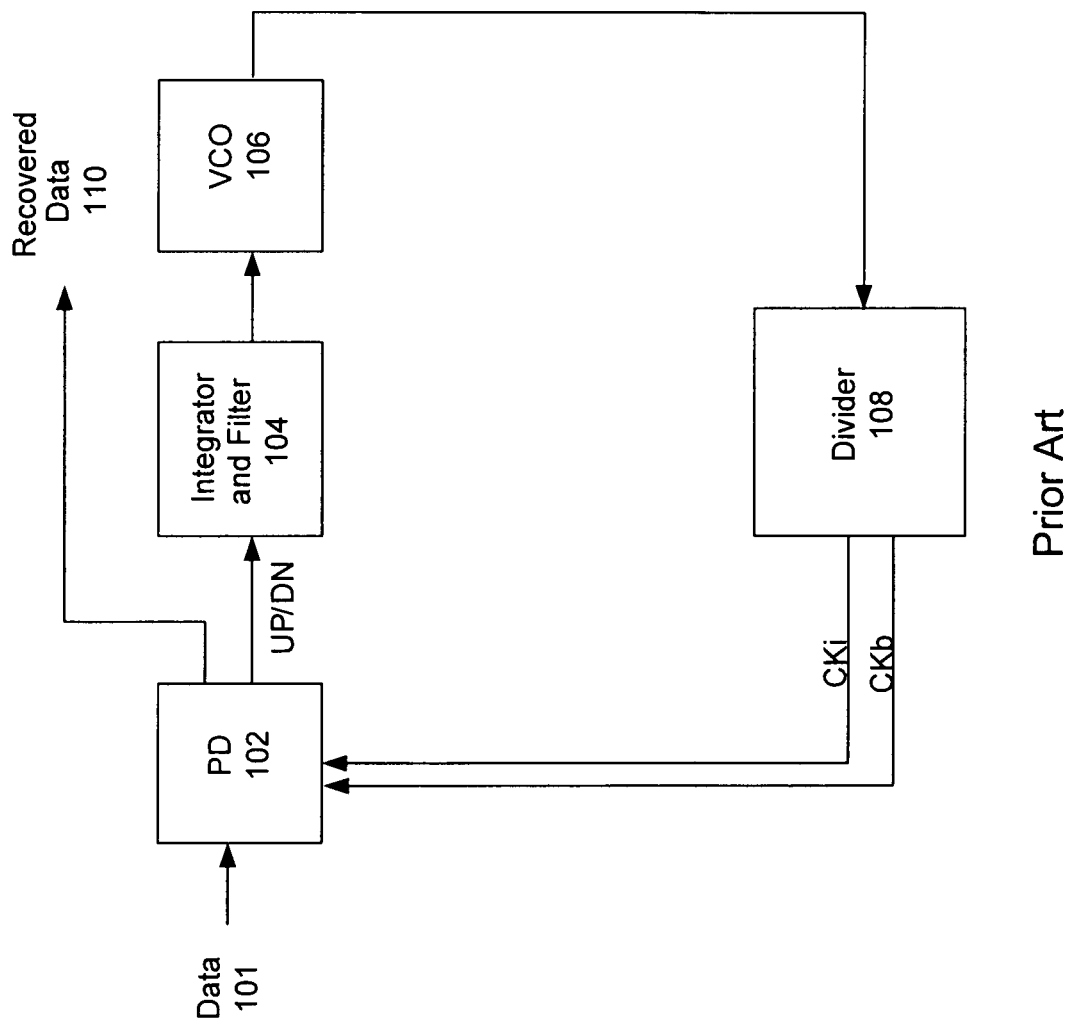
FIG. 1 illustrates a conventional design involved in performing a jitter tolerance test.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

Various embodiments provide a system and method for performing on die, built-in self test, jitter tolerance tests. The disclosed system and method provide, for example, a potentially cheaper, more convenient method of assessing the jitter tolerance of various electrical components.

A system and method are disclosed for performing on die jitter tolerance testing. A set of clocks are generated based on an input signal. The set of clocks include in an in-phase clock CKi based on the data switching edge of the input signal. Additionally, the set of clocks include an inverted clock phase shifted by 180 degrees CKb, and a pair of clocks, CKb_0 and CKb_1 phase shifted positively and negatively by a certain number of degrees, θ (theta). Jitter tolerance is assessed on an input signal at a value θ, where θ is the value by which clocks CKb_0 and CKb_1 are phase shifted in opposite directions from CKb. This places the switching edge of CKb at the middle of the valid data of the input signal. It is determined whether the values of the input signal, CKb, CKb_0, and CKb_1 match to determine whether the input signal is valid at a width of 2*θ degrees. The value of θ may be varied to test the validity of the input signal at various phase widths. By testing for jitter tolerance at various θ values, the eye opening of the input signal data can be estimated.

Referring now to Figure (FIG.) 1, illustrated is a conventional design involved in performing a jitter tolerance test. Data 101 input couples with phase detector (PD) 102 which couples with integrator and filter 104. Integrator and filter 104 couples with voltage-controlled oscillator 106. voltage-controlled oscillator 106 couples with divider 108, which couples with PD 102.

Data 101 is input to a phase detector 102 for jitter tolerance analysis. Often, a bang-bang PD is used to sample the incoming data 101. The PD 102 outputs up or down signals based on the phase differences detected between data 101 and other inputs to be discussed. The PD 102 is communicatively coupled to an integrator and filter 104. The PD 102 output signals are transmitted to an integrator and filter 104 as is common in the art. Among other purposes, the filter 104 may limit the amount of reference frequency energy appearing at the phase detector output and is subsequently applied to the communicatively coupled voltage-controlled oscillator (VCO) 106 input. The integrator and filter 104 may also serve to help determine loop dynamics or stability. For example, it can assist in determining how the loop responds to changes in frequency or clock division. The VCO 106 generates an in-phase clock (CKi) aligned with the data-in 101 switching edge and transmits the in-phase clock to a divider 108. The divider 108 divides the in-phase clock and generates an inverted phase clock CKb. The inverted phase clock is transmitted to the PD 102 and used to sample input data 101. The PD 102 can then assess the jitter tolerance of the input data 101.

Figure 2:
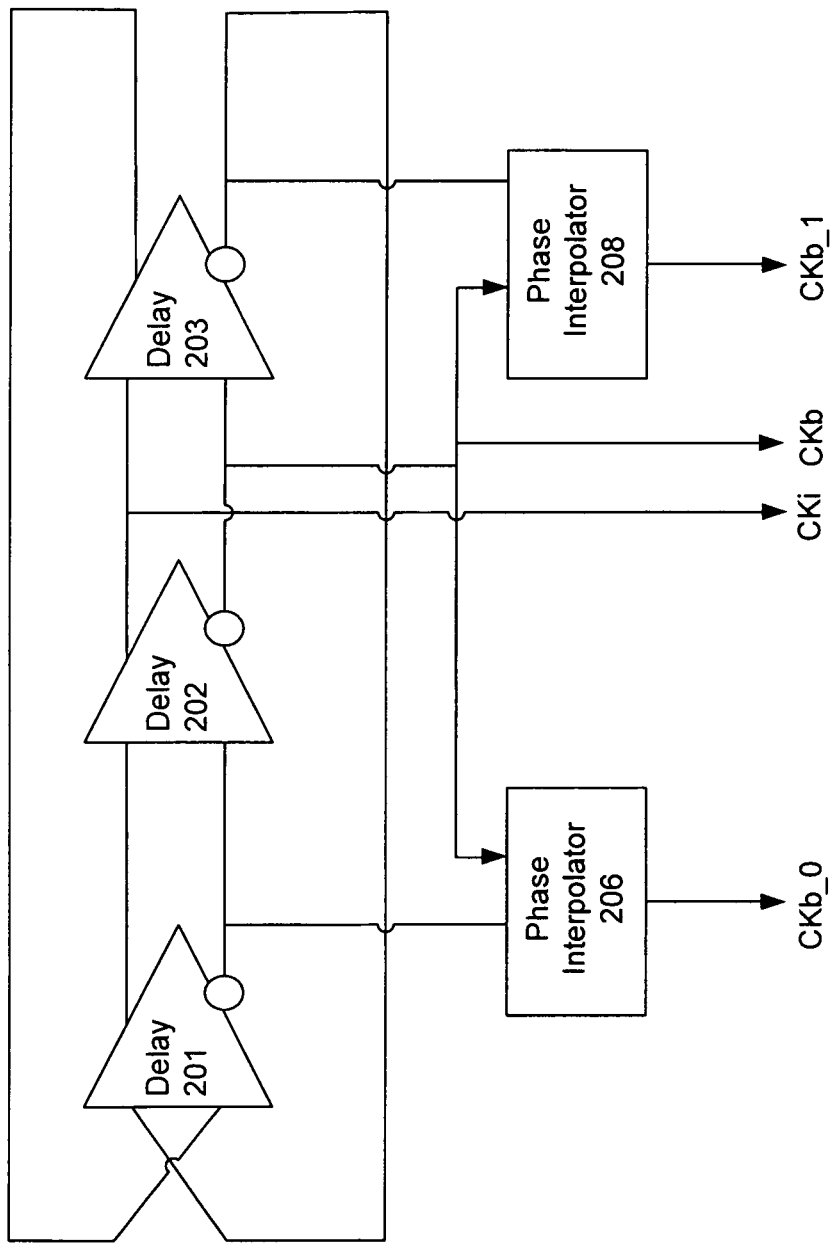
FIG. 2 illustrates a circuit for generating a set of full rate clocks used in jitter tolerance testing in accordance with one example embodiment.

FIG. 2 illustrates a block diagram of a circuit for generating a set of clocks used in jitter tolerance testing in accordance with one example embodiment. The system utilizes three differential delay elements, delay 201, delay 202 and delay 203 serially connected to one another to generate the set of clocks. Each differential delay element has two inputs and two inputs, and is connected so as to form a ring-type oscillator, so that the outputs of the delay elements 201-203 can output clock signals having the same frequency, but shifted phases.

An in-phase clock (CKi) is generated by the VCO and aligned with the switching edge of input data similarly to FIG. 1. The circuit illustrated in FIG. 2 is configured to generate additional clocks CKb, CKb_0, and CKb_1. CKb is also analogous to the clock discussed in FIG. 1. CKb is an inverted phase clock of the in-phase clock Cki. CKb is phase shifted approximately 180 degrees from CKi. Additionally, CKb_0 and CKb_1 are generated through the use of phase interpolator 206 and phase interpolator 208, respectively. In one embodiment, CKb_0 and CKb_1 are symmetrically adjusted to be phase adjusted by the same amount in opposite directions. For example, CKb_0 is phase shifted a negative 15 degrees while CKb_1 is phase shifted a positive 15 degrees. However, this is not necessary and the two clock signals may be shifted by differing amounts in each direction. In the case of symmetrical phase shifting, CKb_0 and CKb_1 are said to be shifted +/−θ degrees. In one embodiment, θ is programmable and adjustable by the phase interpolators during runtime allowing further functionality during jitter tolerance tests. The amount of degrees by which phase interpolators 206 and 208 phase shift the clock signal CKb may be adjusted by hardware inputs or software instructions.

Figure 2A:
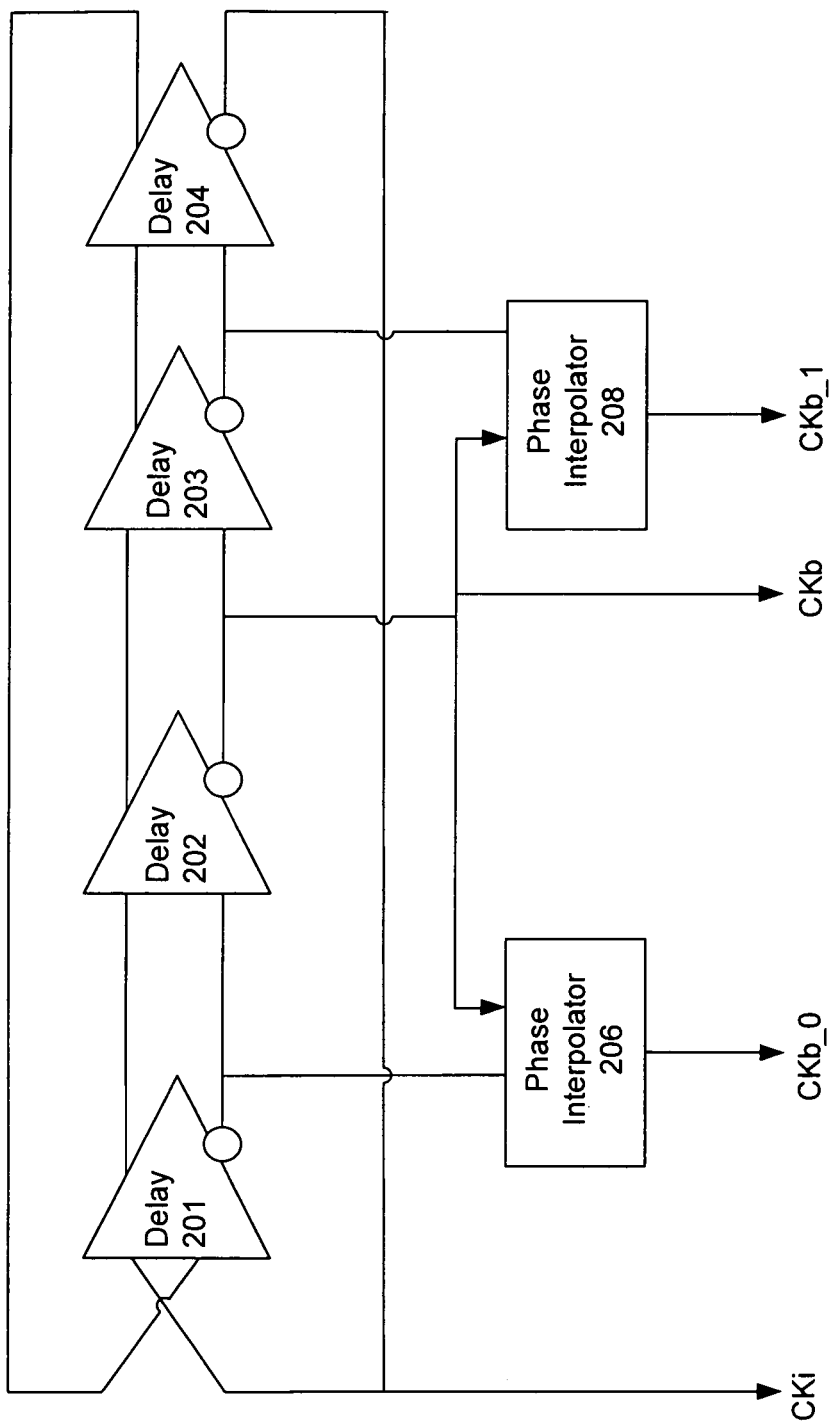
FIG. 2A illustrates a circuit for generating a set of half rate clocks used in jitter tolerance testing in accordance with one example embodiment.

FIG. 2A illustrates a circuit for generating a set of half rate clocks used in jitter tolerance testing in accordance with one example embodiment. The system utilizes four differential delay elements, delay 201, delay 202, delay 203, and delay 204 serially connected to one another to generate the set of clocks similarly to the ring oscillator of FIG. 2. Each differential delay element has two inputs and two inputs, and is connected so as to form a ring-type oscillator, so that the outputs of the delay elements 201-204 can output clock signals having the same frequency, but shifted phases.

Figure 3:
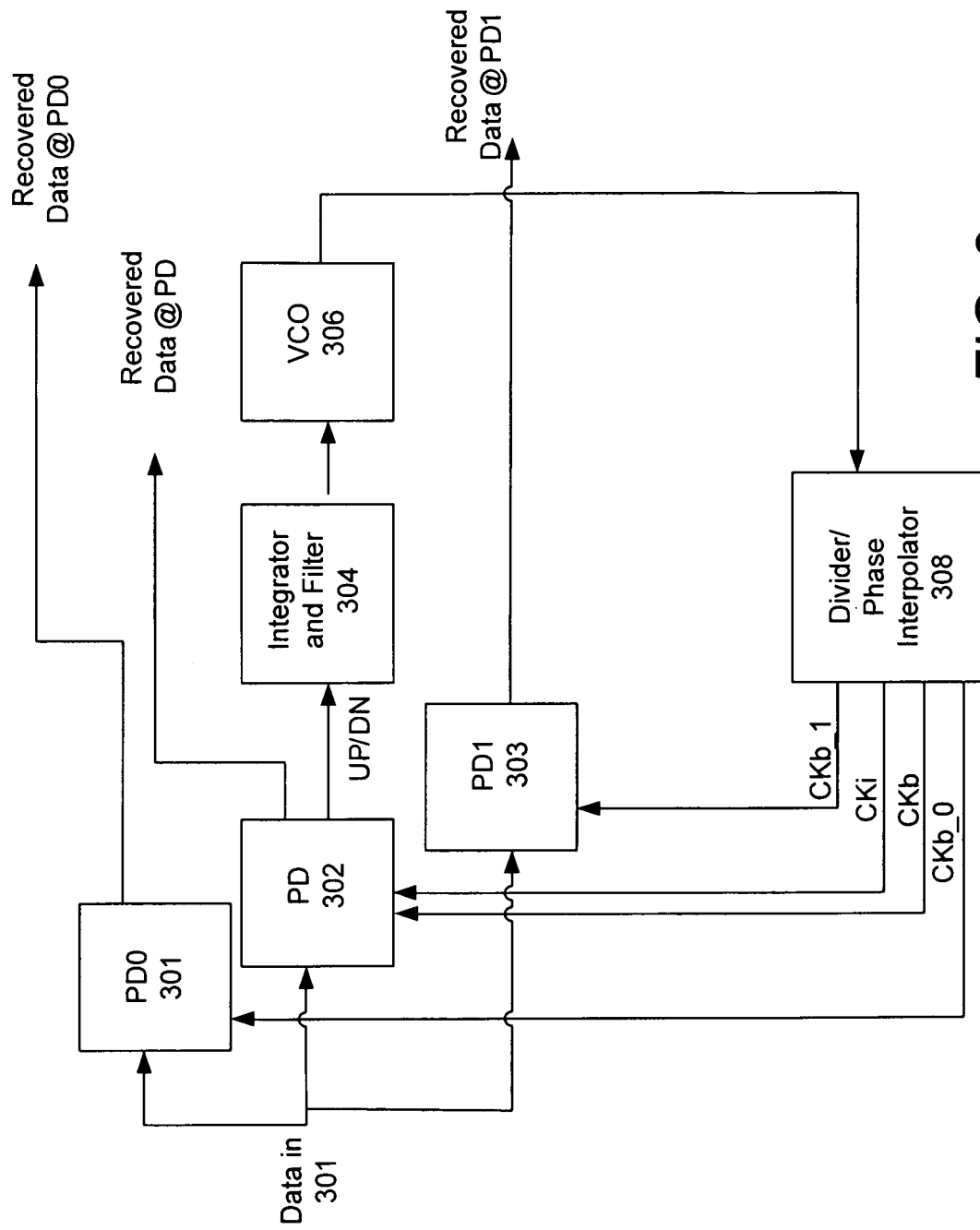
FIG. 3 illustrates a jitter tolerance test system in accordance with one example embodiment.

An in-phase clock (CKi) is generated by the VCO and aligned with the switching edge of input data similarly to FIG. 1. The circuit illustrated in FIG. 3 is configured to generate additional clocks CKb, CKb_0, and CKb_1. CKb is also analogous to the clock discussed in FIG. 1. CKb is an inverted phase clock of the in-phase clock Cki. CKb is phase shifted approximately 180 degrees from CKi. Additionally, CKb_0 and CKb_1 are generated through the use of phase interpolator 206 and phase interpolator 208, respectively. In one embodiment, CKb_0 and CKb_1 are symmetrically adjusted to be phase adjusted by the same amount in opposite directions. For example, CKb_0 is phase shifted a negative 15 degrees while CKb_1 is phase shifted a positive 15 degrees. However, this is not necessary and the two clock signals may be shifted by differing amounts in each direction. In the case of symmetrical phase shifting, CKb_0 and CKb_1 are said to be shifted +/−θ degrees. In one embodiment, θ is programmable and adjustable by the phase interpolators during runtime allowing further functionality during jitter tolerance tests. The amount of degrees by which phase interpolators 206 and 208 phase shift the clock signal CKb may be adjusted by hardware inputs or software instructions.

FIG. 3 illustrates a jitter tolerance test system in accordance with one example embodiment. The jitter tolerance test system includes phase detectors PD0 301, PD 302 and PD1 303. The system also includes an integrator and filter 304, VCO 306 and divider/phase interpolator 308. Data input 301 couples with phase detectors 301, 302, and 303. PD 302 couples with integrator and filter 304, which couples with VCO 306. VCO 306 couples with divider/phase interpolator 308, which couples with the phase detectors 301, 302, and 303. Data is recovered from outputs of the three phase detectors 301, 302, and 303.

Data 301 is input to phase detectors 301, 302 and 303 for jitter tolerance analysis. The PD 302 outputs up or down signals based on the differences detected between data 101 and input signal CKb. The PD 302 is communicatively coupled to an integrator and filter 304 similar to the process described in FIG. 1. Among other purposes, the filter 304 may limit the amount of reference frequency energy appearing at the phase detector output and is subsequently applied to the communicatively coupled voltage-controlled oscillator (VCO) 306 input. The integrator and filter 304 may also serve to help determine loop dynamics or stability. For example, it can assist in determining how the loop responds to changes in frequency or clock division. The VCO 306 generates an in-phase clock (CKi) aligned with the data-in 301 switching edge and transmits the in-phase clock to a divider 308.

The divider 308 generates an inverted phase clock CKb. In addition, phase interpolator 308 produces phase shifted signals CKb_0 and CKb_1. In one embodiment, the phase shifted signals are symmetrically shifted in opposite phase directions as previously discussed. For example, CKb_0 is phase shifted −20 degrees and CKb_1 is phase shifted +20 degrees. However, the phase shifted signals are not necessarily shifted by the same amount or in opposite directions. CKi and CKb are transmitted to PD 302 while CKb_0 is transmitted to PD0 301 and CKb_1 is transmitted to PD1 303. Each of these phase detectors can then assess, and output a corresponding voltage signal, the difference in phase between data-in 301 and their clock signals received from divider 308. At a given θ value, or value by which CKb_0 and CKb_1 are phase shifted, the jitter tolerance test system can determine whether the data-in 301 input is valid. By varying the θ value, the jitter tolerance test system can then approximately determine and model the data eye width of the data-in 301. The eye width helps assess the timing synchronization and jitter effects in the data-in 301 input. An eye diagram, from which the term eye width originates is named for the oscilloscope display in which a digital data signal from a receiver is repetitively sampled and applied to the vertical input, while the data rate is used to trigger the horizontal sweep. The eye width indicates the horizontal space between each of the eyes in a signal.

Figure 4:
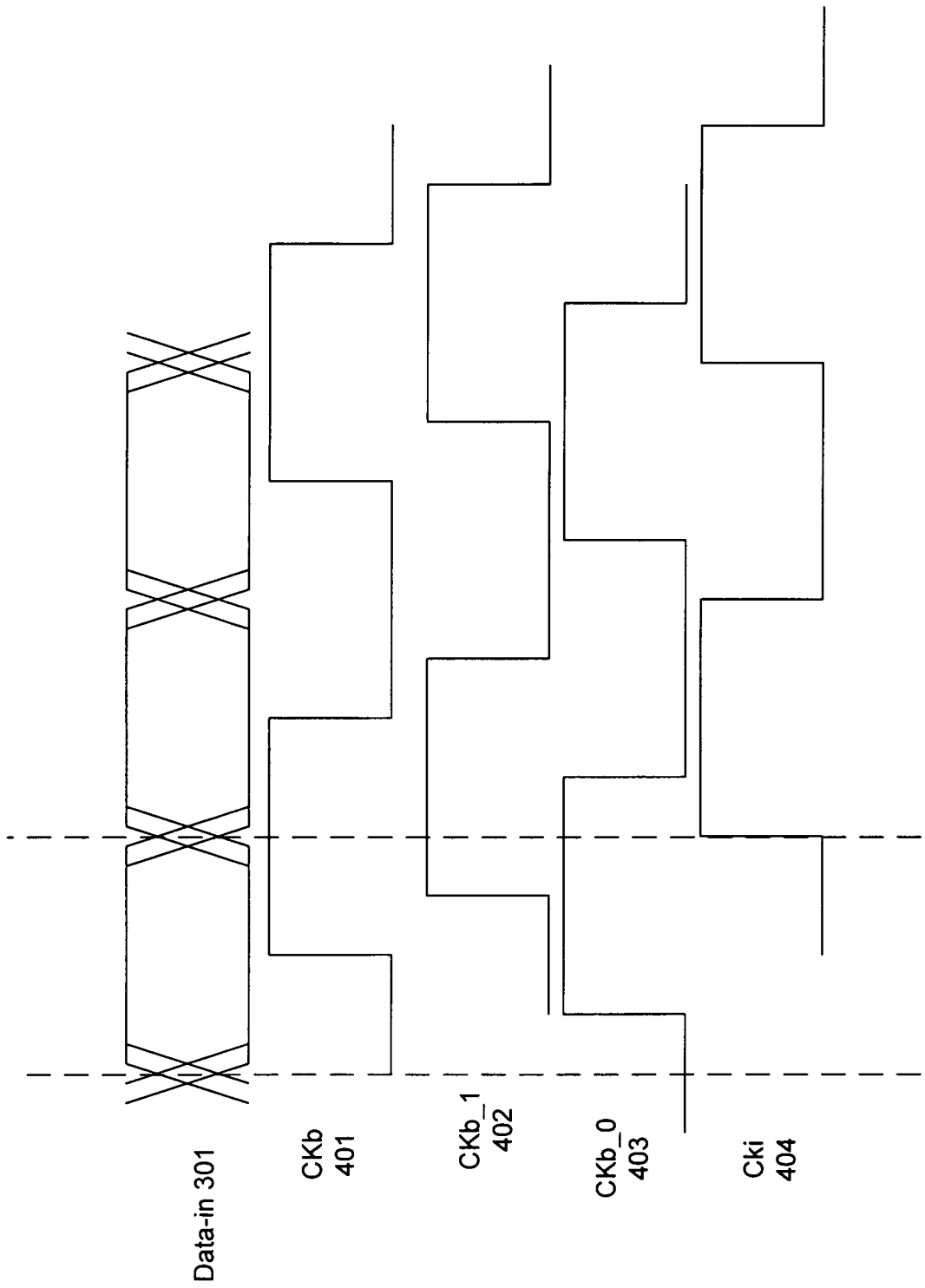
FIG. 4 illustrates the clocks output by divider 308 in accordance with one example embodiment.

FIG. 4 illustrates the clocks output by divider 308 in accordance with one example embodiment. As previously described, divider 308 outputs CKb 401, CKb_1 402, CKb_0 403, and CKi 404 based on Data-in signal 301. Cki 404 is aligned in-phase with data-in 301 and shares a data switching edge. In one embodiment, Cki 404 is generated by the VCO 306. In one embodiment, CKb 401 is generated by phase shifting CKi 180 degrees, which places its switching edge near the center of the valid data in data-in 301. In the illustrated embodiment, CKb_0 and CKb_1 are phase shifted by an equal amount of degrees (θ) in opposite directions. Data-in 301 is compared at three instances based on the phase shifted clocks CKb, CKb_0, and CKb_1 with the assistance of the three phase detectors. In the illustrated example, the three phase shifted signals would be accurate, resulting in passing a jitter tolerance test. However, if θ is increased, the phase shifted clocks may get nearer the data switching edge of data-in 301 and produce different results when data-in 301 is latched nearer its signal edge, resulting in failing of a jitter tolerance test. By varying θ, the eye opening of a data signal can be determined. An example embodiment of this process is illustrated in the flow chart of FIG. 5.

Figure 5:
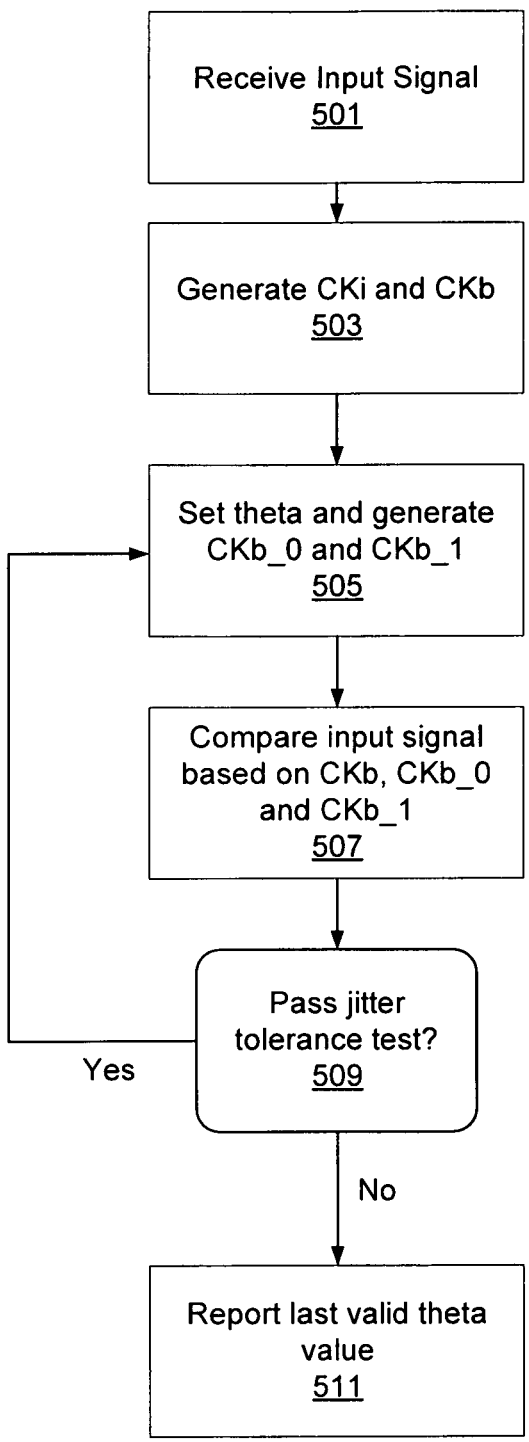
FIG. 5 is a flow chart illustrating a method for determining the eye opening of input data according to one embodiment.

FIG. 5 is a flow chart illustrating an example method for determining the eye opening of input data according to one embodiment. An input signal is received 501. An in-phase clock CKi and a clock shifted by 180 degrees CKb are generated 503. CKb_0 and CKb_1 are generated 505 and phase shifted from CKb by a value θ. In one embodiment, θ is set to an initial value when eye opening analysis begins and the initial value is used during a first pass. The input signal is compared 507 at the signal edge of each of the three phase shifted clock signals CKb, CKb_0 and CKb_1. In one embodiment, if the data latched from the input signal at the three latch times matches, the signal is determined to have passed 509 a jitter tolerance test. The system then returns to step 505 at increased θ value, which results in testing the input signal at CKb_0 and CKb_1 which have been phase shifted by larger amounts, decreasing the likelihood of passing the jitter tolerance test. When the jitter tolerance test eventually fails, the eye opening can be calculated based on the θ values for which the jitter tolerance test succeeded. In other embodiments, the value of θ may be incremented or decremented by various amounts, tests may be repeated, or any other step may be taken to better account for false positives or other testing errors.

The desired configuration provides advantages that, for example, include the ability to perform an on-die jitter tolerance pass/fail test at a certain θ. The width of data eye opening can also be measured through repeated jitter tolerance tests at various θ values. The disclosed system and method provide a potentially cheaper, more convenient method of assessing the jitter tolerance of various electrical components. Testing reliant on soldered connections during production assembly and looped back high speed signals after assembly need not be performed after implementation of the disclosed on die jitter tolerance system and method. The desired configuration can be utilized in any automatic test equipment, system margin testing, and in diagnostic tests.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as described in FIG. 2. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The phrase "in one embodiment" in various places in the specification is not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article; or apparatus that comprises a list of elements is not, necessarily limited to only those elements but may include other elements not expressly listed or inherent to such process, method, article, or apparatus. Further, unless expressly stated to the contrary, "or" refers to an inclusive or and not to an exclusive or. For example, a condition, A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and method for perfuming jitter tolerance tests through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for determining jitter tolerance, the method comprising:
   generating an inverted signal having a phase shifted by approximately 180 degrees from a phase of a received input signal;
   generating a first phase shifted signal having a phase shifted by a first amount in a first direction relative to an edge of the inverted signal;
   generating a second phase shifted signal having a phase shifted by a second amount in a direction opposite to the first direction;
   detecting a value of the input signal at each of three distinct latch times corresponding to the edge of the inverted signal, an edge of the first phase shifted signal, and an edge of the second phase shifted signal;
   comparing each of the detected values of the input signal; and
   generating a result of the comparison, the result of the comparison indicative of a measure of jitter tolerance of the input signal.

2. The method of claim 1, wherein the result of the comparison indicates that a jitter tolerance test has been passed when each of the detected values of the input signal match.

3. The method of claim 2, further comprising:
   increasing the first amount of phase shift applied to the first phase shifted signal and increasing the second amount of phase shift applied to the second phase shifted signal; and
   comparing the detected values of the input signal again based on the increased first amount and second amount.

4. The method of claim 3, wherein at least one of the first amount and the second amount are repeatedly increased until at least one of the detected values of the input signal no longer matches another detected value.

5. The method of claim 1, wherein the result of the comparison indicates a jitter tolerance test has failed when at least one of the detected values of the input signal does not match another detected value of the input signal.

6. The method of claim 1, wherein the result of the comparison is represented by an eye width diagram.

7. The method of claim 1, wherein the first amount of phase shift applied to the first phase shifted signal is equal to the second amount of phase shift applied to the second phase shifted signal.

8. The method of claim 1, wherein the first amount of phase shift applied to the first phase shifted signal is different from the second amount of phase shift applied to the second phase shifted signal.

9. A non-transitory computer-readable medium comprising instructions that when executed by a processor cause the processor to:
   generate an inverted signal having a phase shifted by approximately 180 degrees from a phase of a received input signal;
   generate a first phase shifted signal having a phase shifted by a first amount in a first direction relative to an edge of the inverted signal;
   generate a second phase shifted signal having a phase shifted by a second amount in a direction opposite to the first direction;
   detect a value of the input signal at each of three distinct latch times corresponding to the edge of the inverted signal, an edge of the first phase shifted signal, and an edge of the second phase shifted signal;
   compare each of the detected values of the input signal; and
   generate a result of the comparison, the result of the comparison indicative of a measure of jitter tolerance of the input signal.

10. The non-transitory computer-readable medium of claim 9, wherein the result of the comparison indicates that a jitter tolerance test has been passed when each of the detected values of the input signal match.

11. The non-transitory computer-readable medium of claim 10, further comprising instructions that when executed by the processor cause the processor to:
    increase the first amount of phase shift applied to the first phase shifted signal and increase the second amount of phase shift applied to the second phase shifted signal; and
    compare the detected values of the input signal again based on the increased first amount and second amount.

12. The non-transitory computer-readable medium of claim 11, wherein the first amount and the second amount are repeatedly increased until at least one of the detected values of the input signal no longer matches another detected value.

13. The non-transitory computer-readable medium of claim 9, wherein the result of the comparison indicates a jitter tolerance test has failed when at least one of the detected values of the input signal does not match another detected value of the input signal.

14. The non-transitory computer-readable medium of claim 9, wherein the result of the comparison is represented by an eye width diagram.

15. The non-transitory computer-readable medium of claim 9, wherein the first amount of phase shift applied to the first phase shifted signal is equal to the second amount of phase shift applied to the second phase shifted signal.

16. The non-transitory computer-readable medium of claim 9, wherein the first amount of phase shift applied to the first phase shifted signal is different from the second amount of phase shift applied to the second phase shifted signal.

17. An integrated circuit comprising:
    a voltage controlled oscillator comprising a plurality of delay elements, the voltage oscillator configured to generate an inverted signal having phase shifted by approximately 180 degrees from a phase of an input signal based on a frequency of the input signal;
    a plurality of phase interpolators comprising:
      a first phase interpolator coupled to receive an output of a first delay element of the plurality of delay elements and generate a first phase shifted signal having a phase shifted by a first amount in a first direction relative to an edge of the inverted signal; and
      a second phase interpolator coupled to receive an output of a second delay element of the plurality of delay elements and generate a second phase shifted signal having a phase shifted by a second amount in a direction opposite to the first direction; and
    a plurality of phase detectors, each of the plurality of phase detectors configured to:
      compare a phase of the input signal with a phase of one of the inverted signal, the first phase shifted signal, or the second phase shifted signal; and
      generate a result of the comparison indicative of a measure of jitter tolerance of the input signal.

18. The integrated circuit of claim 17, wherein the plurality of delay elements are serially connected to one another.

19. The integrated circuit of claim 17, wherein the first phase interpolator includes an input to receive a first adjustment signal to adjust the first amount of phase shift applied to the first phase shifted signal.

20. The integrated circuit of claim 17, wherein the second phase interpolator includes an input to receive a second adjustment signal to adjust the second amount of phase shift applied to the second phase shifted signal.

21. The integrated circuit of claim 17, wherein the first amount and the second amount are adjustable during runtime of the integrated circuit.

* * * * *